Aug. 30, 1966 R. L. THOMPSON 3,269,872

THERMOELECTRIC DEVICE AND METHOD OF MANUFACTURE

Filed March 19, 1962

Inventor
Robert L. Thompson
by Paul A. Frank
His Attorney

United States Patent Office 3,269,872
Patented August 30, 1966

3,269,872
THERMOELECTRIC DEVICE AND METHOD OF MANUFACTURE

Robert L. Thompson, Ballston Lake, N.Y., assignor to General Electric Company, a corporation of New York

Filed Mar. 19, 1962, Ser. No. 180,562
11 Claims. (Cl. 136—208)

My invention relates to a thermoelectric device, and in particular to a new structural arrangement for thermoelectric elements and their associated electrical conductors and to the manufacture of this new structural arrangement.

A phenomenon known as the Peltier effect exists to some extent at all junctions of dissimilar materials. This phenomenon occurs when two materials having dissimilar thermoelectric properties are joined and a direct electrical current is passed through this assembly, thereby causing the junction to become either relatively hot or cold, depending on the direction of the electrical current flowing through the junction. Due to a combination of thermal and electrical properties, some materials produce a Peltier effect of much greater magnitude than others, and these materials are known as thermoelectric materials. The Peltier effect may be employed in devices which will provide either heating or cooling, depending on whether the object to be heated or cooled is placed near the relatively hot or cold junctions of the thermoelectric device. A phenomenon known as the Seebeck effect may be thought of as being the reverse of the Peltier effect. In this phenomenon, when two materials having dissimilar thermoelectric properties are joined at more than one junction and the junctions are maintained at different temperatures, a direct current will flow therethrough, its direction depending upon the respective location of the relatively hot and cold junctions. Thus, a thermoelectric device may be employed for heating, cooling and for generating electricity.

Thermoelectric devices are generally available in a planar structure wherein the heat is transferred from one planar surface to a second parallel planar surface, or each planar surface is maintained at different temperatures to generate a direct current. However, if a flow of fluid material is to be heated or cooled, or it is desired to generate direct current with at least one of the thermal junctions being maintained at a temperature determined by a fluid flow, the planar type of structure is not the most satisfactory.

Further, in the manufacture of thermoelectric devices, the conventional method is to cut thermoelectric materials to size and to arrange their respective positions on electrical conductor links which form the thermal junctions before soldering the individual elements to form a completed device. This time-consuming procedure results in an extremely high cost product.

Therefore, one of the principal objects of this invention is to develop a new thermoelectric device which provides a heat exchange surface to a flow of fluid.

Another object of this invention is to develop an improved method of manufacturing a thermoelectric device in a minimum amount of time.

A feature of my invention which is useful in the fulfillment of the foregoing objects includes a method for constructing a thermoelectric device that consists of a helical series array of alternately connected dissimilar thermoelectric elements, the method comprising the steps of surrounding a tubular member with a pair of radially spaced apart electrical conductors, positioning members of dissimilar thermoelectric material between the conductors, and cutting the assembled structure along a helical path advancing in the axial direction of the tubular member.

The features which I desire to protect herein are pointed out with particularity in the appended claims. The invention itself, together with further objects and advantages thereof, may best be understood by reference to the following description when considered in connection with the accompanying drawing wherein like parts in each of the figures are identified by the same reference character and wherein:

Figure 1:
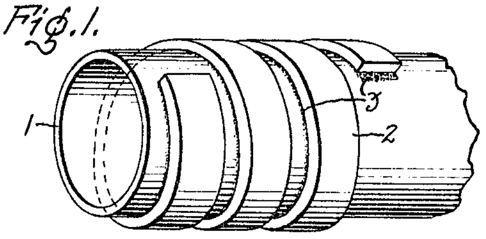
FIGURE 1 is a perspective view of a tubular member helically wound with an electrical conductor.
Figure 2:
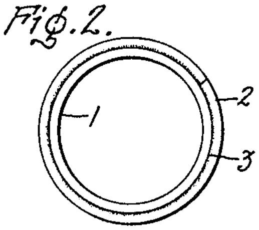
FIGURE 2 is an end view of FIGURE 1.

Referring particularly to FIGURE 1, there is shown a tubular member designated by numeral 1 which may be of any cross-sectional shape such as square or rectangular but is preferably shown as a cylindrical tube and adapted to enclose a fluid material flowing within the inner surface of the tubular member. The tubular member may be composed of numerous materials, the only requirements being that it be good thermal conductor and not react with whatever fluid material flows therein. Thus, tubular member 1 may be composed of copper or anodized aluminum for many applications. The fluid flowing axially within the inner tubular surface may be a fluid that is desired to be heated or cooled, or it may be a fluid that is to maintain an ambient temperature within the inner surface of the tubular member. In the latter case it should have the characteristics of being a good thermal conductor. The fluid material may be a liquid, gas, or a fluid material with solid particles therein. A first electrical conductor material 2 is then placed in close contact with the tubular member by an electrically insulated clamping means or adhesively joined as shown in FIGURE 1. An adhesive 3 may be applied to the tubular member or to the electrical conductor material and may comprise a thin layer of a synthetic organic polymer adhesive such as epoxy resin, one of the polyesters, or a natural organic material such as cellulose. The adhesive also electrically insulates tubular member 1 from first electrical conductor material 2, and should be applied as a thin layer to avoid decreasing the thermal conductance between the tubular member and electrical conductor. The adhesive material may be fortified with non-electrically conducting, high thermally conducting materials such as aluminum oxide or berylium oxide. Electrical conductor 2 must also be a good thermal conductor and may be a sheet of copper material of tubular shape similar to tubular member 1 thereafter cut in a helical path to form a long continuous helical strip, or preferably it may initially be a long continuous strip of copper material which is helically wound on tubular means 1 as illustrated in FIGURE 1. FIGURE 2 is an end view of FIGURE 1, illustrating the circular shape of the tubular member.

Figure 3:
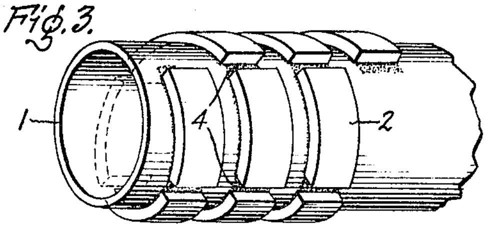
FIGURE 3 is a perspective view of the assembly illustrated in FIGURE 1 after a series of axial parallel cuts are made in the electrical conductor.
Figure 4:
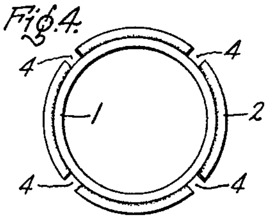
FIGURE 4 is an end view of FIGURE 3.

The resulting continuous helical strip of electrical conductor material is then severed by cutting with a saw in a direction parallel to the longitudinal axis of the tubular means as illustrated in FIGURES 3 and 4 by numerals 4. A series of these cuts 4 is made, preferably at equally spaced-apart points around the circumference of the tubular means, thereby resulting in a helical path of small spaced-apart electrical conductor segments or strips, the strips being arranged in parallel rows running in a direction parallel to the longitudinal axis of the tubular member. The number of rows as determined by the number of the saw cuts may be any number greater than one, the maximum number being primarily limited by the width dimension of the thermo-electric material which subsequently is to be placed thereon. FIGURE 4 is an end view of FIGURE 3 illustrating electrical conductor strip 2 cut at four equally spaced-apart points to form four rows of electrical conductor strips. Electrical conductor 2 may also initially be in a parallel spaced-apart strip form of four strips, each having a length equal to the length of the tubular member, and subsequently cut in a helical manner to result in the configuration shown in FIGURES 3 and 4.

Figures 5, 6:
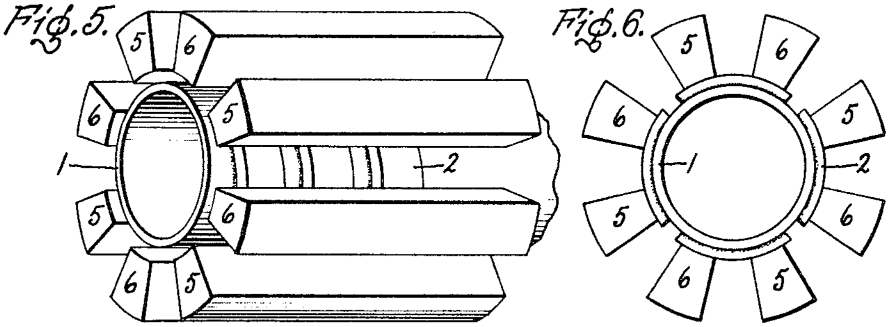
FIGURE 5 is a perspective view of the assembly illustrated in FIGURE 3 after bars of thermoelectric material are placed on the electrical conductor strips.
FIGURE 6 is an end view of FIGURE 5.

In the next step as illustrated in FIGURES 5 and 6, bars of thermoelectric material are either soldered on the rows of electrical conductor strips, or placed thereon after having been prepared for soldering and then held in place by some means such as a temporary retaining member. Two bars of thermoelectric material are utilized for each row of electrical conductor strips, the two bars having dissimilar thermoelectric properties, conventionally designated in semiconductor terminology as P-type and N-type. The bars preferably precut to the desired length and may be preshaped to provide arcuate surfaces on an inner and outer side of each thermoelectric bar to permit the bars to be in close union with the electrical conductor strips that will contact both the inner and outer sides. The thermoelectric material may be selected from a number of known materials, for example, certain alloys or bismuth, lead, or antimony, combined in varying quantities with telurium or selenium and having slight amounts of impurities such as silver, gold, or sulphur. I prefer to employ an alloy of bismuth telluride since this semiconductor thermoelectric material exhibits an exceptionally favorable combination of thermal and electrical properties. As illustrated in FIGURES 5 and 6, two bars of this thermoelectric material are placed on each row of electrical conductor strips, the P-type designated by numeral 5, and the N-type by numeral 6, the bars being spaced apart from each other in parallel relationship and disposed in a direction parallel to the longitudinal axis of tubular member 1.

A second electrical conductor material is now wrapped around and in contact with the outer sides of the thermoelectric bars. This second electrical conductor material should exhibit the same characteristics as the first electrical conductor material, namely, that it be a very good electrical conductor and thermal conductor, a preferred material being copper. The second electrical conductor may take one of severeal forms. It may be a closed tubular sheet which is fitted over the thermoelectric bars to be in close contact therewith, but more preferably is a tubular sheet split on one side, thereby permitting the second electrical conductor to be conveniently placed in contact with the thermoelectric bars without danger of damaging the rather brittle thermoelectric material. The second electrical conductor is then severed by making a series of saw cuts equal in number to those made in the first electrical conductor and in a direction parallel to the longitudinal axis of the tubular member and at such equally spaced-apart points around the circumference of the tubular member that the resulting segments or strips are in overlapping relation with the first electrical conductor strips. Another alternative is to precut the second electrical conductor into individual strips of length equal to the length of the tubular member and of proper width to cover two adjacent bars of thermoelectric material and space therebetween that each of these conductor strips is to contact. The outer side of the thermoelectric bars and the second electrical conductor which were both previously prepared for soldering are now soldered together, and if the inner sides of the thermoelectric bars had not been previously soldered to the first electrical conductor, then the entire soldering operation may be performed at this time by placing the entire assembly into an oven.

Figure 7:
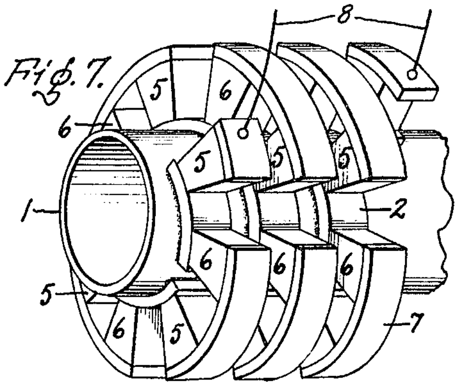
FIGURE 7 is a perspective view of the completely assembled device after a helical cut is made in a second electrical conductor and the thermoelectric material; and, FIGURE 8 is an end view of FIGURE 7 with a tubular member placed around the second electrical conductor.
Figure 8:
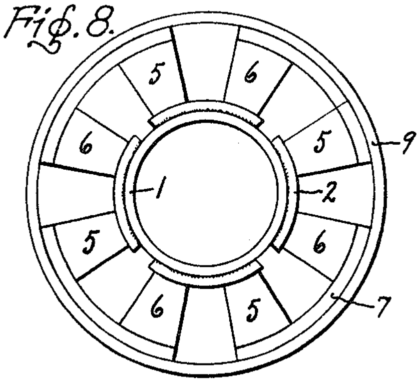

The final step involves cutting, as with a saw, through the second or outer electrical conductor 7 and completely through the thermoelectric bars 5 and 6 in a helical pattern wherein the saw cut is superimposed on the space between the turns of the helically wound first electrical conductor 2. Alternatively, the helical cutting may extend through the first electrical conductor if it had not previously been formed into a helical pattern. Finally, the second electrical conductor may also be a long continuous strip, helically wound on the outer sides of the thermoelectric bars, of width equal to and wound in the same manner as the first electrical conductor, thereby being superimposed around it, in which case the helically wound second conductor is then severed by a series of cuts in a direction parallel to the longitudinal axis of the tubular member as recited earlier and the final step involves cutting only through the thermoelectric bars in the helical pattern determined by the second electrical conductor. This helical cutting operation results in a structure as shown in FIGURE 7 wherein a series array of alternately connected thermoelectric elements 5 and 6 is formed in a generally helical path around the tubular member. FIGURE 8 illustrates an end view of the structure of FIGURE 7, showing that the alternately connected thermoelectric elements continue completely around the tubular means to form an annular structure.

It can be appreciated that the herein disclosed method of manufacturing a thermoelectric device permits manufacture within a much lesser time than it would take to first cut the thermoelectric material and electrical conductor material to the individual element sizes and then to position these relatively small elements in preparation for soldering wherein extreme care is necessary to not displace any element.

Terminal means, with wires 8 connected thereto, may be attached to an electrical conductor strip at each end of the tubular means. The terminal means and wires are preferably attached to the electrical conductor that forms the heated junction rather than the cooled junction since the flow of electricity and heat through the wire would add some heat to the cooled junction, thereby decreasing the efficiency of the thermoelectric device.

A thermal insulation material such as foamed polyurethane may be placed in the spaces between the thermoelectric elements to minimize any flow of heat within this region, thereby providing a more efficient device.

A fluid to be cooled is preferably caused to flow or be contained within tubular member 1. The transfer of heat in this thermoelectric device is effected in the following manner. When a direct electrical current is caused to flow in the proper direction through the series array of alternately connected thermoelectric elements 5 and 6 in FIGURE 7, the first electrical conductor strips 2, which form the junctions of the thermoelectric elements at the tubular member 1, become cold junctions and heat is extracted from the fluid flowing within the inner surface of tubular member 1 due to the thermoelectric properties of the thermoelectric elements. This heat is transferred to the second electrical conductor strips 7 through the thermoelectric elements. The second electrical conductor strips 7 therefore, become hot junctions, being heated from this transfer of heat and also from the $I^2R$ losses within the device. Therefore, more heat is actually released from the hot junctions than is absorbed from the cold junctions. Since a greater surface area exists outside the hot junctions to radiate the greater heat present at that surface, it is preferable to cause a fluid that is to be cooled to flow within tubular member 1. Depending on the type of material that surrounds the hot junctions as a heat absorbing substance, it may also be preferable to place a second tubular means 9 about the hot junctions and then cause a second fluid to flow outside the second tubular member to absorb and carry away the heat being dissipated at the hot junctions. There will be a finite temperature differential across both the first and second tubular member, and for this also, it is preferable to have the cold fluid flowing within the inner or first tubular member since the smaller amount of heat transfer therethrough creates a smaller temperature differential across the first tubular member, thereby producing a more efficient thermoelectric device. The second electrical conductor junctions may, of course, be used alone as radiating means in which case these hot junctions radiate the heat absorbed from the cold junctions directly to the atmosphere. If it is desired to cool a fluid which cannot flow through the inner tubular member, the second electrical conductor junctions can be employed as the cold junctions and the heat transferred to the inner tubular member and then to a heat conducting fluid flowing therein to carry away the heat. In like manner, a fluid to be heated is preferably caused to flow outside the second electrical conductor junctions with the aid of a second tubular member. This fluid becomes heated by absorbing heat from a fluid flowing within the inner tubular member, the heat being transferred through the first electrical conductor junctions, thermoelectric elements and to the second electrical conductor junctions.

The thermoelectric device may likewise be utilized as a direct current generator. In the preferred embodiment, a cooled fluid is caused to flow within the inner tubular means, and a heated fluid is caused to flow outside an outer tubular means positioned about the second electrical conductor. The cooled and heated fluids cool and heat the first electrical conductor junctions and second electrical conductor junctions respectively, and this differential in temperatures at the alternate junctions generates a direct electrical current due to the thermoelectric properties of the thermoelectric elements. The direction of electrical current flow is determined by the respective locations of the heated and cooled fluid flows and of the N- and P-type thermoelectric elements.

Having described a new structural arrangement for a thermoelectric device and a method for manufacturing the device in accordance with my invention, it is believed obvious that other modifications and variations of my invention are possible in light of the above teachings. For example, the cross-section of the tubular means may be noncircular and the electrical conductor need not be in strip form but could have an inner surface that conforms to the tubular means and an outer surface that is a planar surface. The particular configurations of tubular member, electrical conductors and thermoelectric elements disclosed herein may be of many different shapes, the only requirement being that the resulting assembly consists of a series array of alternately connected thermoelectric elements, arranged in a generally helical path. It is therefore, to be understood that changes may be made in the particular embodiment of the invention described which are within the full intended scope of the invention as defined by the following claims.

What I claim as new and desire to secure by Letters Patent of the United States is:

1. A thermoelectric device comprising, a thermally conductive tubular member, a first electrical conductor means helically disposed on an outer surface of said tubular member and electrically insulated therefrom, a second electrical conductor means spaced radially outward from said first electrical conductor means and disposed in a helical path parallel thereto, and a plurality of spaced apart thermoelectrical semi-conductor means disposed between said first and second electrical conductor means to form a helical series array of alternately connected thermoelectric elements wherein both said electrical conductor means form junctions between said alternately connected thermoelectric elements, said thermo electric elements adapted to co-act with said junctions to result in a heat transfer from junctions formed by one electrical conductor means to junctions formed by the other electrical conductor means when a direct electrical current flows though the device.

2. A thermoelectric device comprising, a thermally conductive tubular member, a first electrical conductor means helically disposed on an outer surface of said tubular member and electrically insulated therefrom, a second electrical conductor means spaced radially outward from said first electrical conductor means and disposed in a helical path parallel thereto, and a plurality of spaced apart dissimilar thermoelectric semiconductor means disposed between said first and second electrical conductor means to form a helical series array of alternately connected dissimilar thermoelectric elements wherein both said electrical conductor means form junctions between said alternately connected thermoelectric elements, said thermoelectric elements adapted to co-act with said junctions to result in a flow of direct electrical current through the device when said junctions are maintained at different temperatures.

3. The combination set forth in claim 1 wherein, said first electrical conductor means comprises a plurality of thermally conducting electrical conductor strips spaced apart from each other and so disposed as to form a generally helical path on the outer surface of said tubular member, and said second electrical conductor means comprises a plurality of thermally conducting electrical conductor strips spaced apart from each other and so disposed as to form a generally helical path parallel to the helical path formed by said first electrical conductor means, the strips in the two parallel helical paths arranged in overlapping relationship in the direction of the helical paths.

4. The combination set forth in claim 1 wherein said thermoelectric semiconductor means comprises, spaced apart thermoelectric elements of alternately dissimilar thermoelectric properties disposed in a generally helical path as determined by the junctions formed by the electrical conductor means to form said helical series array of alternately connected thermoelectric elements.

5. The combination set forth in claim 1 wherein the thermoelectric elements and electrical conductor junctions are disposed to form rows parallel to the longitudinal axis of the tubular member, and each row of said thermoelectric elements consists of elements having similar thermoelectric properties.

6. A thermoelectric device comprising a thermally conductive tubular member having an inner and outer surface and adapted to enclose a fluid material within said inner surface, a first group of thermoelectric elements of P-type semiconductor material, a second group of thermoelectric elements of N-type semiconductor material, said thermoelectric elements arranged about said tubular member in a generally helical path of spaced-apart alternate P-type and N-type elements, a first group of spaced-apart electrical and thermal conductor means disposed on said tubular member and electrically insulated therefrom, a second group of spaced-apart electrical and thermal conductor means, said second group of conductor means spaced radially outward from said first group of conductor means and in overlapping relationship thereto, both said groups of conductor means extending in paths parallel to the generally helical path described by said thermoelectric elements, conductor means of each group attached to opposite sides of two adjacent thermoelectric elements respectively whereby each of said thermoelectric elements is electrically connected in series between two adjacent thermoelectric elements in a generally helical path.

7. In a method for constructing a thermoelectric device that consists of a plurality of radially spaced-apart discrete electrical conductor strips positioned around a tubular member to form a helical series array of alternately connected thermoelectric elements positioned between the conductor strips, the method comprising the steps of,
   adhesively positioning an electrical conductor around a tubular member,
   severing the electrical conductor to form rows of strips,
   positioning two bars of dissimilar thermoelectric semiconductor material in spaced-apart parallel relation on each row of conductor strips,
   positioning another electrical conductor around the thermoelectrical bars, soldering the thermoelectric bars to the electrical conductors, and
   cutting a helical path in the axial direction of the tubular member to sever at least the thermoelectric bars.

8. The method set forth in claim 7 wherein the step of adhesively positioning an electrical conductor around a tubular member comprises,
   helically winding the conductor around the tubular member in a loose manner adapted to space apart adjacent turns of the winding.

9. The method set forth in claim 8 wherein the step of severing the electrical conductor comprises,
   cutting the conductor in a direction parallel to the longitudinal axis of the tubular member at a plurality of equally spaced-apart points around the circumference of the tubular member.

10. The method set forth in claim 7 wherein the step of positioning another electrical conductor around the thermoelectric bars comprises,
   positioning a plurality of conductor strips equal in number to the rows of other conductor strips on the thermoelectric bars in spaced-apart parallel rows extending in the same direction as the rows of other conductor strips and in overlapping relation thereto,
   and the step of cutting a helical path comprises severing at least the plurality conductor strips and the thermoelectric bars in a helical pattern.

11. The method set forth in claim 7 wherein the step of positioning another electircal conductor around the thermoelectric bars comprises,
   helically winding another conductor around the thermoelectric bars in a loose manner adapted to space apart adjacent turns of the winding,
   and severing said another conductor by cutting the conductor in a direction parallel to the longitudinal axis of the tubular member at a plurality of equally spaced apart points around the circumference of the tubular member and equal in number to the rows of other conductor strips.

References Cited by the Examiner

UNITED STATES PATENTS

| | | | |
|---|---|---|---|
| 2,310,026 | 2/1943 | Higley | 136—5.2 |
| 2,807,657 | 9/1957 | Jenkins et al. | 136—5 |
| 2,959,925 | 11/1960 | Frantti et al. | 136—4.2 |
| 3,117,913 | 1/1964 | Shoupp | 136—4 X |
| 3,126,616 | 3/1964 | Pietsch | 136—5.1 X |

FOREIGN PATENTS

| | | |
|---|---|---|
| 811,755 | 4/1959 | Great Britain. |
| 874,660 | 8/1961 | Great Britain. |

WINSTON A. DOUGLAS, *Primary Examiner.*

JOSEPH REBOLD, *Examiner.*

J. BARNEY, A. B. CURTIS, *Assistant Examiners.*